US011222687B2

(12) United States Patent
Berke et al.

(10) Patent No.: US 11,222,687 B2
(45) Date of Patent: Jan. 11, 2022

(54) SYSTEM AND METHOD FOR POWER PLANE NOISE REDUCTION IN A MEMORY SUBSYSTEM OF AN INFORMATION HANDLING SYSTEM

(71) Applicant: DELL PRODUCTS, LP, Round Rock, TX (US)

(72) Inventors: Stuart A. Berke, Austin, TX (US); Jordan Chin, Austin, TX (US); Ralph H. Johnson, Round Rock, TX (US); Shiguo Luo, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/815,191

(22) Filed: Mar. 11, 2020

(65) Prior Publication Data
US 2021/0287730 A1 Sep. 16, 2021

(51) Int. Cl.
G11C 11/4076 (2006.01)
G11C 11/4074 (2006.01)
G11C 5/04 (2006.01)
G11C 5/14 (2006.01)
H02M 3/156 (2006.01)
G06F 1/324 (2019.01)
G06F 13/42 (2006.01)
H03L 7/081 (2006.01)

(52) U.S. Cl.
CPC ......... *G11C 11/4076* (2013.01); *G06F 1/324* (2013.01); *G06F 13/4291* (2013.01); *G11C 5/04* (2013.01); *G11C 5/143* (2013.01); *G11C 11/4074* (2013.01); *H02M 3/156* (2013.01); *H03L 7/0814* (2013.01); *G06F 2213/0016* (2013.01)

(58) Field of Classification Search
CPC ....... G11C 11/4076; G11C 5/04; G11C 5/143; G11C 11/4074; H02M 3/156; G06F 13/4291; G06F 1/324; G06F 2213/0016; H03L 7/0814
USPC ...................................................... 365/194
See application file for complete search history.

(56) References Cited

U.S. PATENT DOCUMENTS

| 9,405,355 | B2 | 8/2016 | Bahirat | |
| 9,584,014 | B2* | 2/2017 | Miyazaki | H02M 3/156 |
| 2014/0304445 | A1* | 10/2014 | Gervasi | G06F 13/4068 710/301 |
| 2019/0123646 | A1* | 4/2019 | Tarroboiro | H02M 1/08 |
| 2019/0340141 | A1* | 11/2019 | Patel | G06F 3/0673 |
| 2020/0118612 | A1* | 4/2020 | Finn | G11C 7/222 |
| 2021/0141747 | A1* | 5/2021 | Jeong | G06F 13/1673 |

* cited by examiner

*Primary Examiner* — Fernando Hidalgo
(74) *Attorney, Agent, or Firm* — Larson Newman, LLP

(57) ABSTRACT

An memory subsystem of an information handling system includes a memory module and a controller. The memory module includes a Registering Clock Driver (RCD) configured to receive a clock signal. The RCD includes a delay setting and a clock delay circuit to provide a selectable delayed clock signal based upon the delay setting. The memory module further includes a power management integrated circuit (PMIC) with a plurality of switching regulators. The PMIC receives the delayed clock signal and clocks the switching regulators based upon the delayed clock signal. The controller sets the first delay setting.

18 Claims, 7 Drawing Sheets

SYSTEM AND METHOD FOR POWER PLANE NOISE REDUCTION IN A MEMORY SUBSYSTEM OF AN INFORMATION HANDLING SYSTEM

FIELD OF THE DISCLOSURE

This disclosure generally relates to information handling systems, and more particularly relates to power plane noise reduction in a memory subsystem of an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A memory subsystem of an information handling system may include a memory module and a controller. The memory module may include a Registering Clock Driver (RCD) configured to receive a clock signal. The RCD may further include a delay setting and a clock delay circuit to provide a selectable delayed clock signal based upon the delay setting. The memory module may further include a power management integrated circuit (PMIC) with a plurality of switching regulators. The PMIC may receive the delayed clock signal and clock the switching regulators based upon the delayed clock signal. The controller may set the first delay setting

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
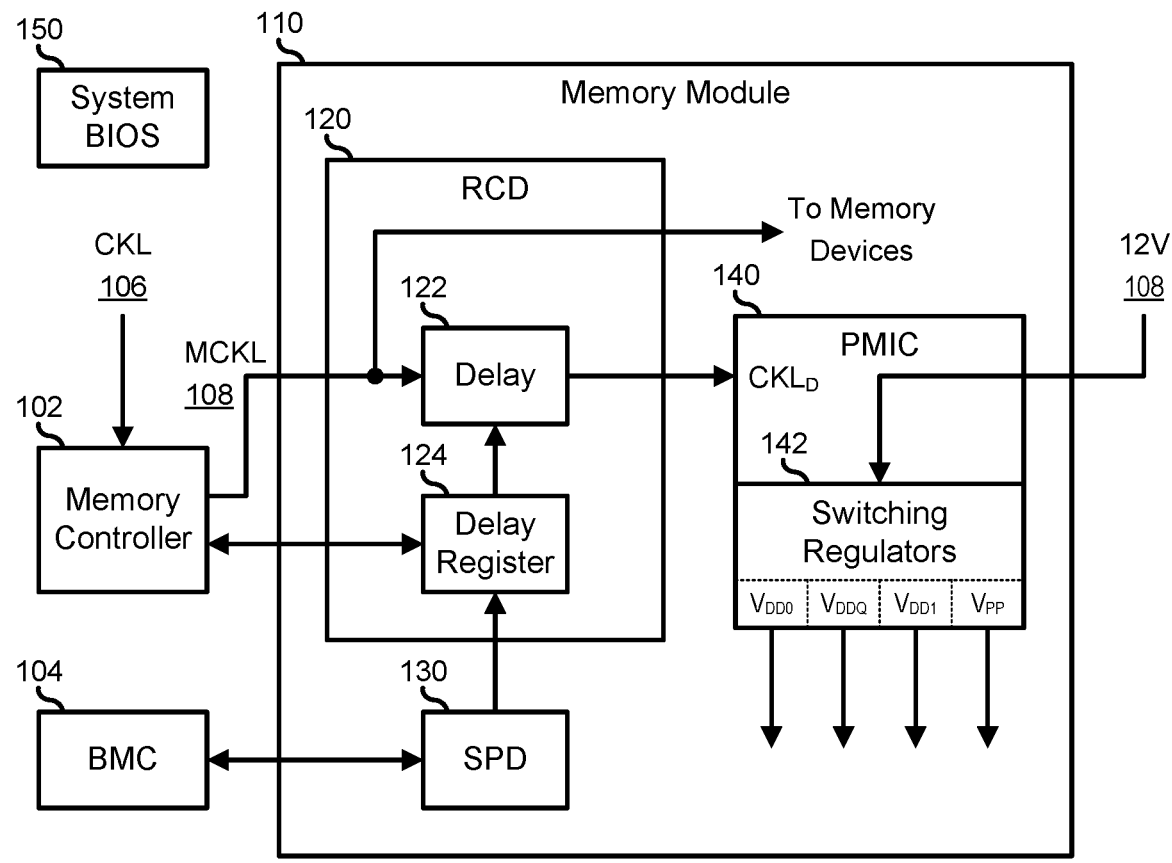
FIG. 1 is a block diagram illustrating a memory subsystem of an information handling system according to an embodiment of the present disclosure.

FIG. 1 illustrates memory subsystem 100 of an information handling system, including a memory controller 102, a baseboard management controller 104, one or more memory module 110, and a system Basic Input/Output System (BIOS) 150. Memory subsystem 100 also includes a clock (CLK) 106 that is provided to memory controller 102 and a memory clock 108 (MCLK) that is provided from the memory controller to memory module 110, and a power rail (12V) 108 that is provided to the memory module. Memory controller 102 represents a portion of memory subsystem 100 that operates to manage the flow of information to the main memory of the memory subsystem, including one or more of memory modules 110. Memory controller 102 operates in accordance with a particular memory architecture implemented on memory subsystem 100. For example, memory controller 102 may operate in accordance with a Double-Data Rate (DDR) standard, such as a JEDEC DDR5 standard. Memory controller 102 may be understood to represent a separate component of memory subsystem 100, or may be integrated with other components of the information handling system, such as with a processor of the information handling system, as needed or desired.

Memory module 110 includes a Registering Clock Driver (RCD) 120, a serial presence detect (SPD) hub 130, and a power management integrated circuit (PMIC) 140. RCD 120 includes a clock delay module 122 and a delay select register 124. RCD 120 represents an integrated circuit device of memory module 110 that processes commands from memory controller 102 via a command/address (C/A) bus (not illustrated) and to provide timing and row and column select signals to the ranks of memory storage devices of memory module 110. The detailed operation of a RCD and interactions with the ranks of memory storage devices of a memory module are known in the art and will not be further described herein, except as needed to illustrate the present embodiments. SPD hub 130 provides for side-band communication and management between the memory storage devices of memory module 110, RCD 120, and PMIC 140 on the memory module, and BMC 104. The details of side-band communication and management of a memory module such as memory module 110 are known in the art and will not be further described herein, except as needed to illustrate the present embodiments. PMIC 140 includes switching voltage regulators 142 that receive power rail 108 and provides DC-DC down-conversion to provide various voltage rails, including two power rails for powering the ranks of memory storage devices ($V_{DD0}$ and $V_{DD1}$), a power rail for powering the I/O drivers of the memory storage devices ($V_{DDQ}$), and an auxiliary power rail ($V_{PP}$). The details of power distribution on a memory module such as memory module 110 are known in the art and will not be further described herein, except as needed to illustrate the present embodiments.

For any given memory domain in an information handling system, that is, for a particular memory controller or group of memory controllers and the associated memory modules, the clocking must be consistent between the memory controllers and the memory modules. However in the particular case of DDR5 memory, or other memory architectures with dedicated voltage regulators, such as PMICs on DDR5 dual in-line memory modules (DIMMs), the clocking to the voltage regulators may not be constrained to be synced with the data clocking domain. In particular, a typical PMIC may operate based upon an internal clocking mechanism whose clocking frequency is determined by the manufacturer of the particular PMIC.

It has been further understood by the inventors of the present disclosure that the DC-DC down conversion circuits of a PMIC, typically provided as a buck-converter, typically generates large noise spikes on the 12 V power rail due to the hard-switching action of the high-side MOSFETs of the circuits. Moreover, because a PMIC typically provides four or more voltage rails ($V_{DD0}$, $V_{DD1}$, $V_{DDQ}$, and $V_{PP}$), it is possible for a particular PMIC design to provide the hard-switching of all of the high-side MOSFETs simultaneously, injecting noise spikes onto the 12 V power rail that are sufficiently large to cause data corruption or other problems in data quality. As such, the inventors of the present disclosure have determined that a PMIC design that switches the various voltage regulators in quadrature, that is, in 90 degree offsets from the supplied switching clock, is preferable because the noise spikes injected onto the 12 V power rail are smaller and distributed in time, resulting in less noise coupling or other data quality problems. However, with current server designs providing for up to 32 memory modules, it is still possible for the switching events across multiple memory modules to align, such that the noise injected onto the 12 V power rail is excessively large. A particular solution is to provide inductive chokes or beads on the 12 V power rail close to the memory modules to suppress the noise spikes, but such solutions are costly both in terms of the component costs, and the real estate footprint on the main circuit board of the server to accommodate the added components.

Returning to FIG. 1, memory clock 108 is provided to memory controller 102 and to RCD 120, where the memory clock is distributed unmodified to the memory storage devices of memory module 110. In this way, for data transfer purposes, the elements of memory subsystem 100 that are required to be within a common clock domain share memory clock 108. In addition, memory clock 108 is provided to clock delay module 122 which operates to provide a selectable delay to the memory clock and to supply the delayed clock ($CLK_D$) to PMIC 140 to clock the switching of switching regulators 142. Clock delay module 122 provides the selectable delay to memory clock 104 based upon the contents of delay select register 124. Delay select register 124, being resident with RCD 120, is accessible to memory controller 102 via control memory transactions on the memory channel between the RCD, such that the contents of the delay select register may be loaded by system BIOS 150 during a system boot process for memory subsystem 100, or during run time operations of the memory subsystem. Further, delay select register 122 is accessible to SPD hub 130, such that the contents of the delay select register may be loaded during a side-band operation performed by BMC 104. Here, providing the delayed clock ($CLK_D$) input to PMIC 140 ensures that the switching events on all memory modules are based upon a common clock, and further permits for the intelligent distribution of the switching events, and hence the slewing out of the noise events, based upon the distribution of the delays among numerous memory modules.

Figure 2:
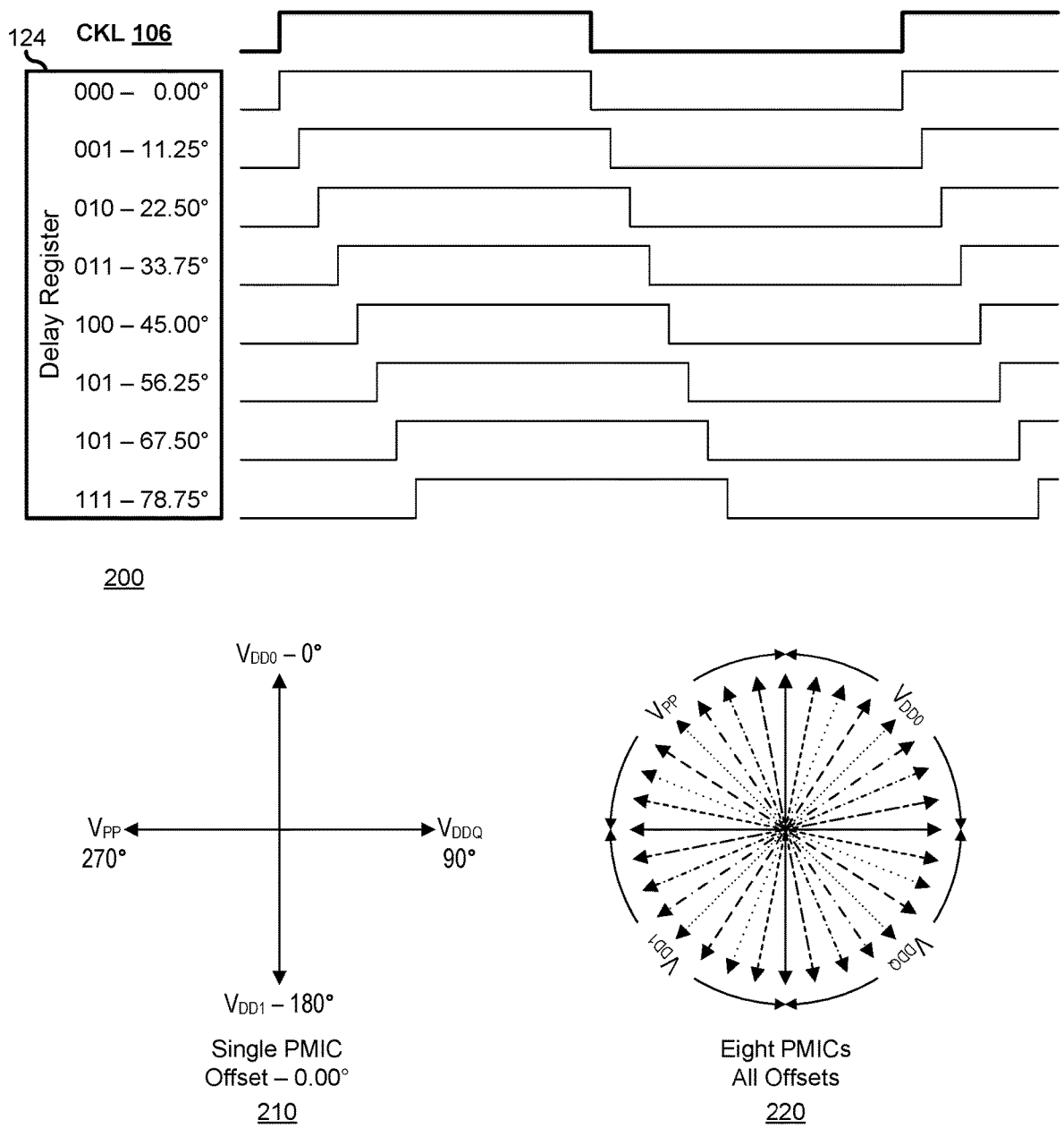
FIG. 2 illustrates clock waveforms and voltage rail phasing for the memory subsystem of FIG. 1.

FIG. 2 illustrates clock waveforms and voltage rail phasing for memory subsystem 100. In particular, waveforms 200 illustrates memory clock 108, and the resulting $CLK_D$ signals based upon a three-bit setting field for delay select register 124, in accordance with a particular example. Here, when delay select register 124 is loaded with "000," $CLK_D$ is unchanged from memory clock 108, that is, clock delay module 122 supplies a 0.00° delay. Then, when delay select register 124 is loaded with "001," $CLK_D$ is delayed by 11.25° from the memory clock, when delay select register 124 is loaded with "010," $CLK_D$ is delayed by 22.50° from the memory clock, and so-on until, when delay select register 124 is loaded with "111," $CLK_D$ is delayed by 78.75° from the memory clock. An exemplary voltage rail phase diagram 210 illustrates the switching of the high-side MOSFETs for the various voltage rails by a single PMIC when the $CLK_D$ is offset by 0.00°, that is, when delay select register 124 is loaded with "000."

The switching regulator for the $V_{DD0}$ rail is switched at 0°, the switching regulator for the $V_{DDQ}$ rail is switched at 90°, the switching regulator for the $V_{DD1}$ rail is switched at 180°, and the switching regulator for the $V_{PP}$ rail is switched at 270°. An exemplary voltage rail phase diagram 220 illustrates the switching of the high-side MOSFETs for the various voltage rails by eight PMICs, each provided with a different one of the eight delayed $CLK_D$ signals. Here, it can be seen that none of the switching events for any of the eight PMICs are aligned, and thus the peak switching noise injected onto the 12 V power rail is diminished by preventing simultaneous steady-state MOSFET switching, such that the amount of inductance needed to lower the noise in the 12 V power rail is reduced. In the illustrated example, delay select register 124 provides eight selectable delays, but this is not necessarily so, and a greater or a lesser number of selectable delays may be provided by a delay select register, as needed or desired. For example, a delay select register may provide 16 selectable delays, each selection incrementally providing delays in steps of 5.625°.

Returning to FIG. 1, memory subsystem 100 operates to manage the delays provided to the PMICs based upon the number and variety of memory modules that are populated within the memory subsystem. For example, when memory subsystem 100 includes eight memory modules similar to memory module 110, then, using the example of FIG. 2, each one of the memory modules can be configured with a different delay select register setting, such that none of the switching times for any of the eight PMICs are aligned. In another example, when memory subsystem 100 includes two memory modules similar to memory module 110, then, using the example of FIG. 2, a first memory module can be configured with a delay select register set to "000" and a second memory module can be configured with a delay select register set to "100." In this way, the switching events would be separated by 45°. Other numbers of memory modules can likewise be configured with delay select registers set to equalize the switching events of the particular number of memory modules.

In a particular embodiment, system BIOS 150 operates to program the various delay select registers during a system boot process for memory subsystem 100. For example, a memory reference code portion of system BIOS 150 can determine a number of installed memory modules and program the delay select registers based upon the number of installed memory modules. In another embodiment, BMC 104 operates to program the various delay select registers out-of-band from the normal processing for memory subsystem 100. For example, BMC 104 can determine a number of installed memory modules and to program the delay select registers based upon the number of installed memory modules. In a particular embodiment, memory modules may instantiate a default delay. Here, one or more pins of a connector can be allocated to provide a slot ID associated with a location of the memory module within the system architecture. Then, based upon the slot location of each particular memory module, and the associated slot ID, the default delay can be provided in delay select register 124. Then further, the default delay can be over-written as described above.

Figure 3:
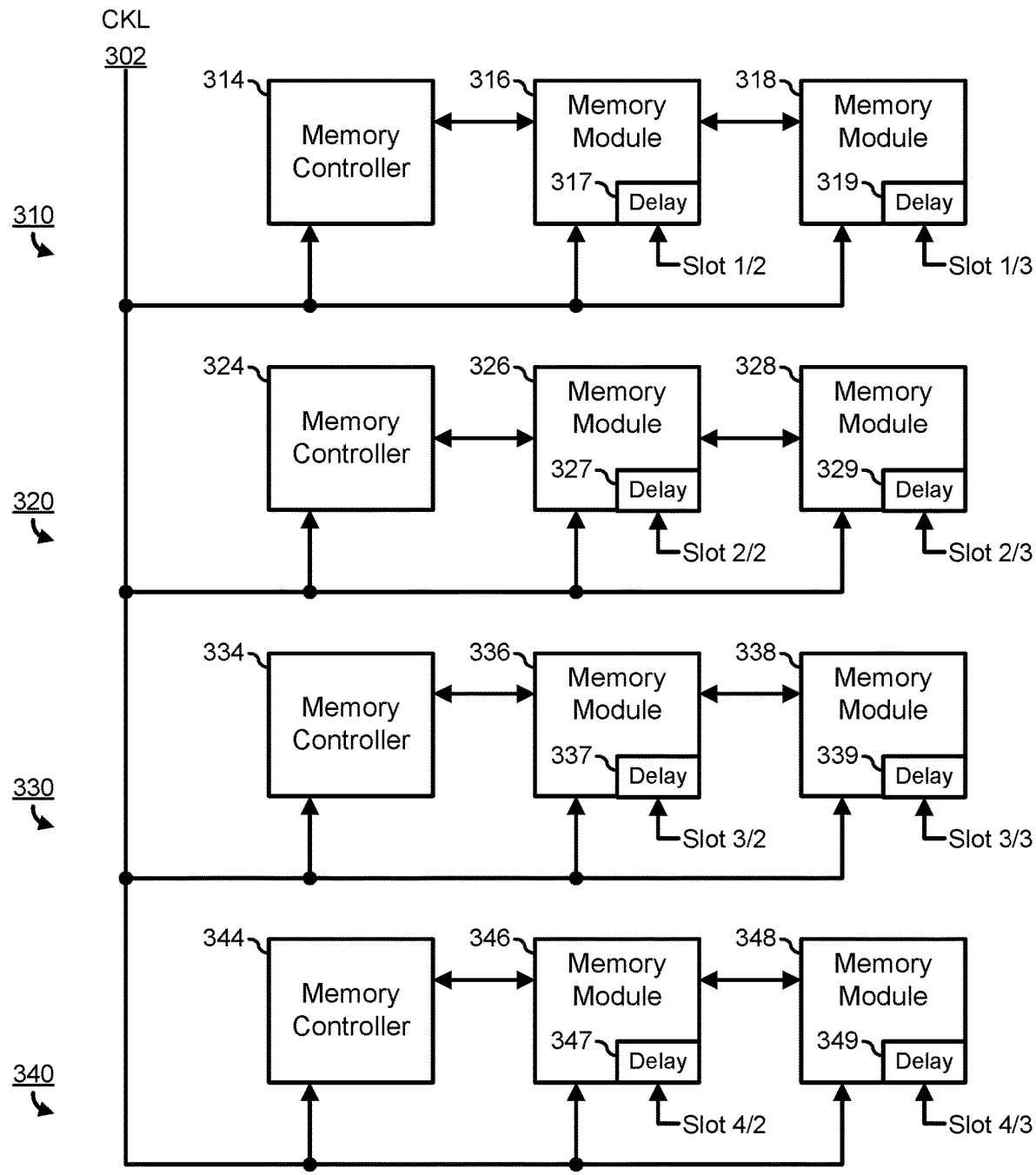
FIG. 3 is a block diagram illustrating a memory subsystem of an information handling system according to another embodiment of the present disclosure.

FIG. 3 illustrates a memory subsystem 300 of an information handling system, including a memory clock (CLK) 302 and memory domains 410, 420, 430, and 440. Memory domain 310 includes a memory controller 314 and memory modules 316 and 318. Memory domain 320 includes a memory controller 324 and memory modules 326 and 328. Memory domain 330 includes a memory controller 334 and memory modules 336 and 338. Memory domain 340 includes a memory controller 344 and memory modules 346 and 348. Here, each of memory modules 316, 318, 326, 328, 336, 338, 346, and 348 are identified by a particular slot ID, for example, based upon one or more pins of a connector, as described above. Here further, each of memory modules 316, 318, 326, 328, 336, 338, 346, and 348 includes an associated delay module 317, 319, 327, 329, 337, 339, 347, and 349, and each of the delay modules operate to select a delay for the associated memory module.

Figure 4:
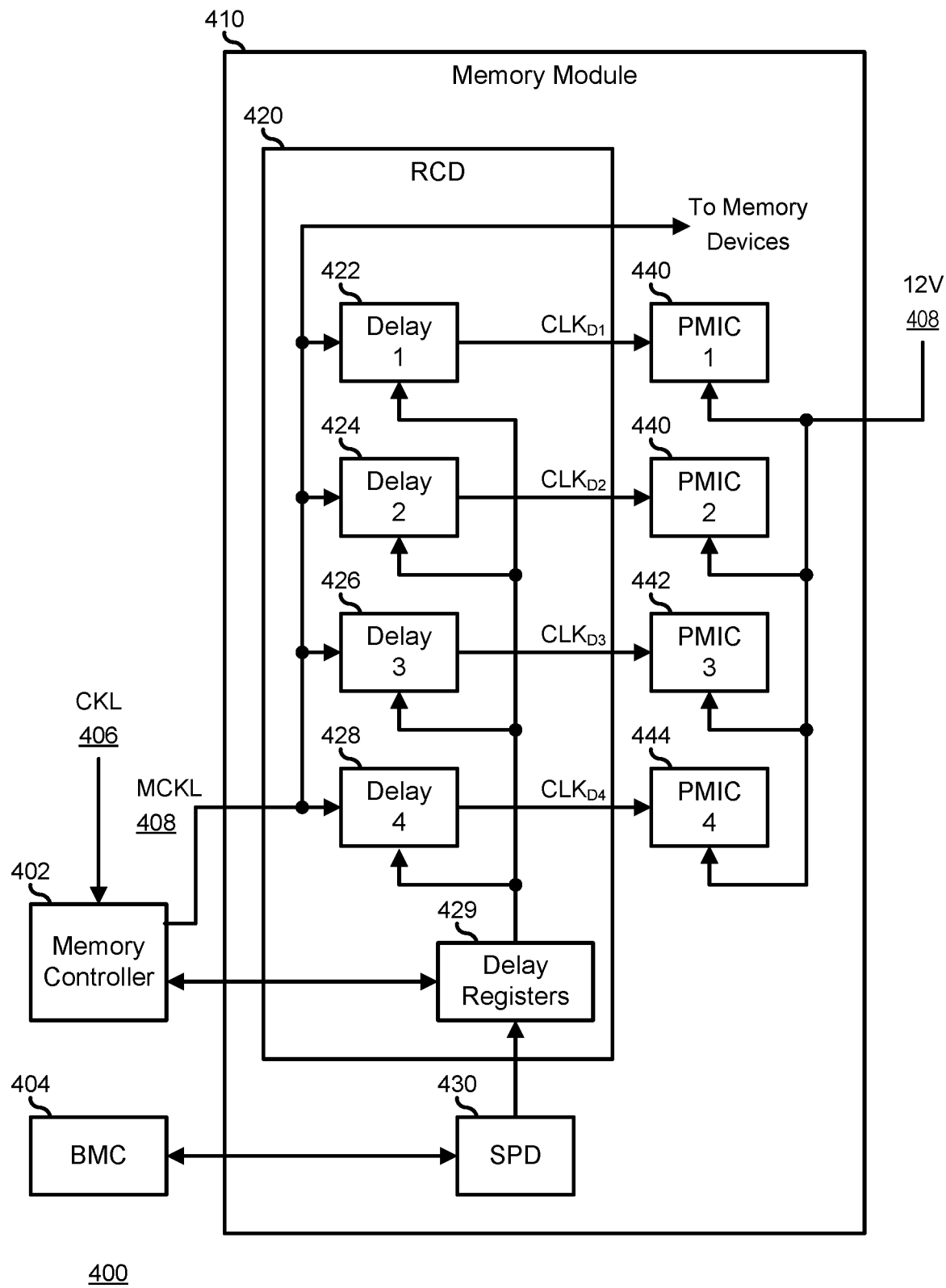
FIG. 4 is a block diagram illustrating a memory subsystem of an information handling system according to another embodiment of the present disclosure.

FIG. 4 illustrates a memory subsystem 400 of an information handling system, including a memory controller 402, a baseboard management controller 404, and one or more memory module 410. Memory subsystem 400 also includes a memory clock (CLK) 406 that is provided to memory controller 402 and a memory clock (MCLK) 407 that is provided from the memory controller to memory module 410, and a power rail (12V) 408 that is provided to the memory module. Memory controller 402 is similar to memory controller 102, and BMC 404 is similar to BMC 104. Memory module 410 is similar to memory module 110, and includes a RCD 420, a SPD hub 430, and PMICs 440, 442, 444, and 446. RCD 420 includes clock delay modules 422, 424, 426, and 428, and delay select registers 429.

PMICs 440, 442, 444, and 446 are typically provided as separate PMICs on a common memory module 410. For example, where a memory module supports multiple memory device types, each memory type may require its own specific voltage. For example, a memory module may include various mixes of DRAM, Flash, Phase-Change Memory (PCM), Magnetoresistive-RAM (MRAM), Nano-RAM (NRAM), or the like, various types of devices, such as memory devices, Application Specific Integrated Circuits (ASICs), Field-Programmable Gate Arrays (FPGAs), or the like, or other combinations, as needed or desired.

Here, the problems associated with switching transient noise being injected onto power rail 408 may remain an issue to be resolved, with the added problem that the switching transient noise may be a bigger issue on memory module 410 because, if the high-side switching aligns between PMICs 440, 442, 444, and 446, the more localized nature of the noise means that smaller noise spikes that are local to the memory module may cause signal quality problems on the memory module that may not be experienced on other memory modules of memory subsystem 100.

As with memory subsystem 100, memory clock 407 is provided to memory controller 402 and to RCD 420, where the memory clock is distributed unmodified to the memory storage devices of memory module 410, and the elements of the memory subsystem that are required to be within a common clock domain share the unmodified memory clock. However, here, memory clock 407 is provided to clock delay modules 422, 424, 426, and 428 which each operate to provide a selectable delay to the memory clock and to supply the delayed clock ($CLK_{D1}$-$CLK_{D4}$) to PMICs 440, 442, 444, and 446 to clock the switching regulators of the PMICs. Clock delay modules 422, 424, 426, and 428 provide the selectable delay to memory clock 404 based upon the contents of delay select registers 429. Delay select registers 429, being resident with RCD 420, is accessible to memory controller 402 via control memory transactions on the memory channel between the RCD, such that the contents of the delay select register may be loaded by a system BIOS during a system boot process for memory subsystem 400, or during run time operations of the memory subsystem. Further, delay select register 429 is accessible to SPD hub 430, such that the contents of the delay select register may be loaded during a side-band operation performed by BMC 404. Here, providing the delayed clocks ($CLK_{D1}$-$CLK_{D4}$) inputs to PMICs 440, 442, 444, and 446 ensures that the switching events on all of the PMICs are slewed to evenly distribute the noise events on memory module 410.

Here, similar to memory subsystem 100, memory subsystem 400 operates to manage the delays provided to the PMICs based upon the number and variety of memory modules that are populated within the memory subsystem. However, where memory subsystem 100 operates to individually program the delays for each memory module, here, memory subsystem 400 operates to consider memory modules with multiple PMICs, and to program the delays for each PMIC intelligently, as described above. Such programming can be performed by a system BIOS or a BMC, as described above.

In another embodiment, the delays provided by delay modules similar to delay modules 422, 424, 426, and 428 are not selectable, but are fixed, and a not selectable. Here, the RCD may not include delay select registers, and the received memory clock is delayed to provide delayed clocks ($CLK_{D1}$-$CLK_{D2}$) based upon the fixed delays. In this way, memory modules that are installed into a memory subsystem that does not intelligently manage the delays to the PMICs of the memory modules installed into the memory subsystem may still benefit from the slewed switching transients on the memory module.

Figure 5:
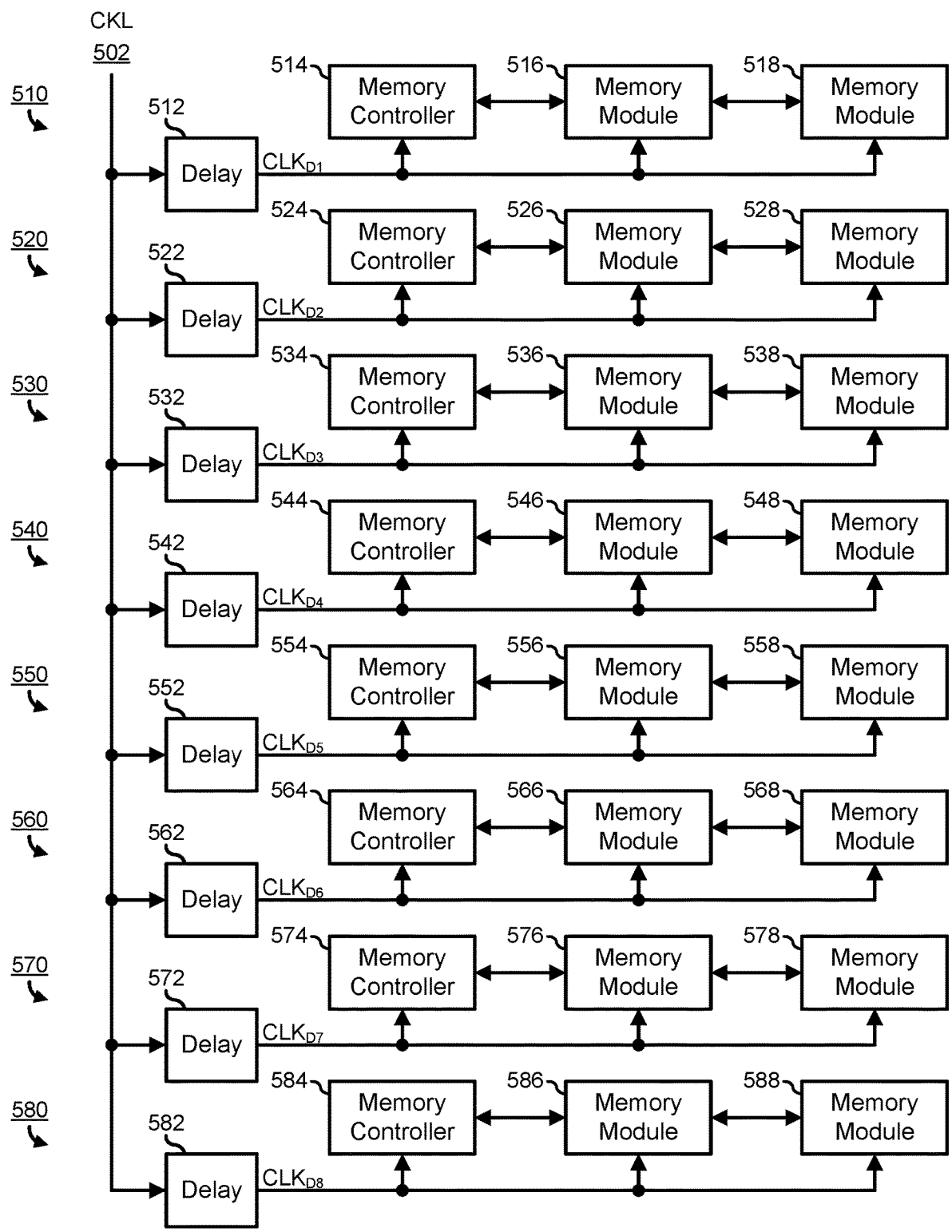
FIG. 5 is a block diagram illustrating a memory subsystem of an information handling system according to another embodiment of the present disclosure.

FIG. 5 illustrates a memory subsystem 500 of an information handling system, including a memory clock (CLK) 502 and memory domains 510, 520, 530, 540, 550, 560, 570, and 580. Memory domain 510 includes a clock delay module 512, a memory controller 514, and memory modules 516 and 518. Memory domain 520 includes a clock delay module 522, a memory controller 524, and memory modules 526 and 528. Memory domain 530 includes a clock delay module 532, a memory controller 534, and memory modules 536 and 538. Memory domain 540 includes a clock delay module 542, a memory controller 544, and memory modules 546 and 548. Memory domain 550 includes a clock delay module 552, a memory controller 554, and memory modules 556 and 558. Memory domain 560 includes a clock delay module 562, a memory controller 564, and memory modules 566 and 568. Memory domain 570 includes a clock delay module 572, a memory controller 574, and memory modules 576 and 578. Memory domain 580 includes a clock delay module 582, a memory controller 584, and memory modules 586 and 588.

Clock delay modules 512, 522, 532, 542, 552, 562, 572, and 582 each receive memory clock 502 and provide a respective delayed clock signal ($CLK_{D1}$-$CLK_{D8}$) output to the respective memory modules 514, 524, 534, 544, 554, 564, 574, and 584, and to respective memory modules 516, 518, 526, 528, 536, 538, 546, 548, 556, 558, 566, 568, 576, 578, 586, and 588. Here, the delays provided by each of clock delay modules 512, 522, 532, 542, 552, 562, 572, and 582 is provided to distribute the switching transients from the PMICs of memory modules 516, 518, 526, 528, 536, 538, 546, 548, 556, 558, 566, 568, 576, 578, 586, and 588, as described above. The delays provided by clock delay modules 512, 522, 532, 542, 552, 562, 572, and 582 may be selectable, as described above, or may be predetermined and fixed based upon the particular design of memory subsystem 500, as described above. In this way, a memory subsystem that includes memory modules that do not allow for the intelligent management of the delays to the PMICs of the memory modules may still benefit from slewed switching transients on the memory modules.

Figure 6:
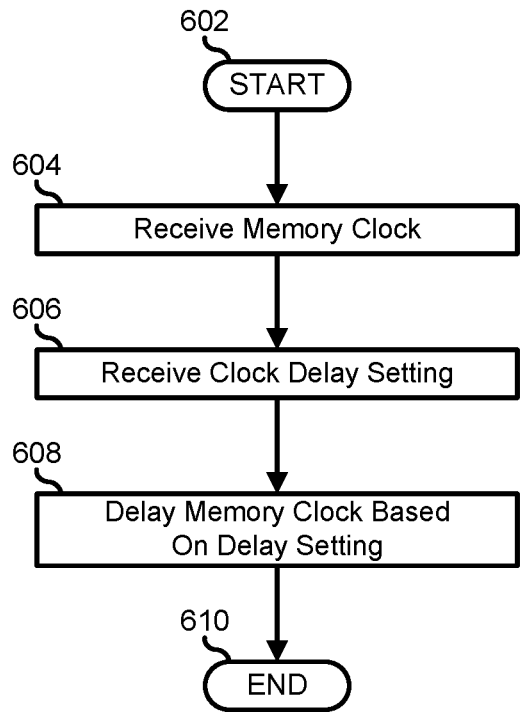
FIG. 6 is a flowchart illustrating a method for power plane noise reduction in a memory module according to an embodiment of the present disclosure.

FIG. 6 illustrates a method for power plane noise reduction in a memory module starting at block 602. A memory clock is received in block 604 and a clock delay setting is received in block 606. For example, a memory module similar to memory modules 110 or 310 can receive a memory clock and can receive one or more clock delay settings for the PMICs on the memory module. In another example, a group of delay modules, one each for a different memory domain, as depicted in FIG. 5, can each receive a memory clock, each delay module providing either a pre-set delay or a programmed delay, as needed or desired. The memory clock is delayed based upon the clock delay setting in block 608 and the method ends in block 610. For example, where the delay module is a part of a memory module similar to memory modules 110 or 310, the delay module can provide the delay in accordance with the associated clock delay register, and can provide the delayed clock to the one or more PMICs on the memory module. In another example, the delay modules associated with each memory domain on a memory subsystem similar to memory subsystem 400 can provide the delayed memory clock to the elements of the associated memory domain, such as the memory controller and the memory modules of the memory domain.

Figure 7:
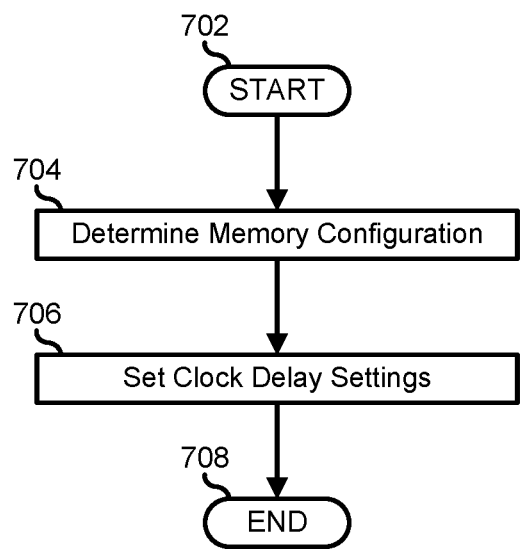
FIG. 7 is a flowchart illustrating a method for power plane noise reduction in a memory subsystem of an information handling system according to an embodiment of the present disclosure.

FIG. 7 illustrates a method for power plane noise reduction in a memory subsystem of an information handling system starting at block 702. A memory configuration is determined in block 704. For example, the memory configuration can be determined by a system BIOS during a system boot process for an information handling system, or a BMC can determine the memory configuration during an out-of-band process. The clock delays for the memory modules or memory domains for the determined memory configuration are set to slew the noise spikes created by switching the high-side MOSFETs of the PMICs of the memory subsystem in block 704, and the method ends in block 706.

Figure 8:
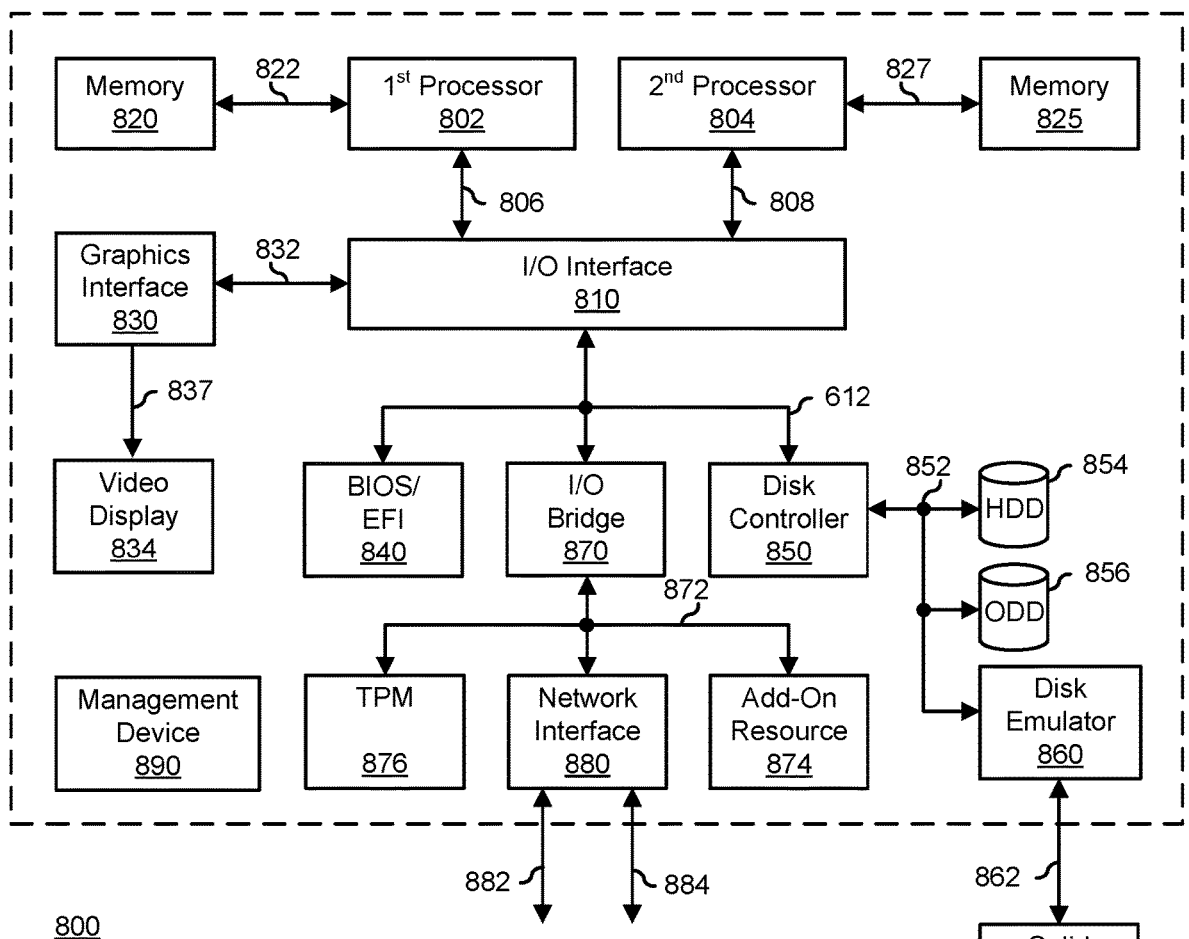
FIG. 8 is a block diagram illustrating a generalized information handling system according to another embodiment of the present disclosure.

FIG. 8 illustrates a generalized embodiment of an information handling system 800 similar to information handling system 100. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 can include devices or modules that embody one or more of the devices or modules described below, and operates to perform one or more of the methods described below. Information handling system 800 includes a processors 802 and 804, an input/output (I/O) interface 810, memories 820 and 825, a graphics interface 830, a basic input and output system/universal extensible firmware interface (BIOS/UEFI) module 840, a disk controller 850, a hard disk drive (HDD) 854, an optical disk drive (ODD) 856, a disk emulator 860 connected to an external solid state drive (SSD) 862, an I/O bridge 870, one or more add-on resources 874, a trusted platform module (TPM) 876, a network interface 880, a management device 890, and a power supply 895. Processors 802 and 804, I/O interface 810, memory 820, graphics interface 830, BIOS/UEFI module 840, disk controller 850, HDD 854, ODD 856, disk emulator 860, SSD 862, I/O bridge 870, add-on resources 874, TPM 876, and network interface 880 operate together to provide a host environment of information handling system 800 that operates to provide the data processing functionality of the information handling system. The host environment operates to execute machine-executable code, including platform BIOS/UEFI code, device firmware, operating system code, applications, programs, and the like, to perform the data processing tasks associated with information handling system 800.

In the host environment, processor 802 is connected to I/O interface 810 via processor interface 806, and processor 804 is connected to the I/O interface via processor interface 808. Memory 820 is connected to processor 802 via a memory interface 822. Memory 825 is connected to processor 804 via a memory interface 827. Graphics interface 830 is connected to I/O interface 810 via a graphics interface 832, and provides a video display output 836 to a video display 834. In a particular embodiment, information handling system 800 includes separate memories that are dedicated to each of processors 802 and 804 via separate memory interfaces. An example of memories 820 and 830 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 840, disk controller 850, and I/O bridge 870 are connected to I/O interface 810 via an I/O channel 812. An example of I/O channel 812 includes a Peripheral Component Interconnect (PCI) interface, a PCI-Extended (PCI-X) interface, a high speed PCI-Express (PCIe) interface, another industry standard or proprietary communication interface, or a combination thereof. I/O interface 810 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/UEFI module 840 includes BIOS/UEFI code operable to detect resources within information handling system 800, to provide drivers for the resources, initialize the resources, and access the resources. BIOS/UEFI module 840 includes code that operates to detect resources within information handling system 800, to provide drivers for the resources, to initialize the resources, and to access the resources.

Disk controller 850 includes a disk interface 852 that connects the disk controller to HDD 854, to ODD 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits SSD 864 to be connected to information handling system 800 via an external interface 862. An example of external interface 862 includes a USB interface, an IEEE 1394 (Firewire) interface, a proprietary interface, or a combination thereof. Alternatively, solid-state drive 864 can be disposed within information handling system 800.

I/O bridge 870 includes a peripheral interface 872 that connects the I/O bridge to add-on resource 874, to TPM 876, and to network interface 880. Peripheral interface 872 can be the same type of interface as I/O channel 812, or can be a different type of interface. As such, I/O bridge 870 extends the capacity of I/O channel 812 when peripheral interface 872 and the I/O channel are of the same type, and the I/O bridge translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as I/O interface 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Management device 890 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 800. In particular, management device 890 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 800, such as system cooling fans and power supplies. Management device 890 can include a network connection to an external management system, and the management device can communicate with the management system to report status information for information handling system 800, to receive BIOS/UEFI or system firmware updates, or to perform other task for managing and controlling the operation of information handling system 800. Management device 890 can operate off of a separate power plane from the components of the host environment so that the management device receives power to manage information handling system 800 when the information handling system is otherwise shut down. An example of management device 890 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 890 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A memory subsystem of an information handling system, the memory subsystem comprising:
    a first memory module including:
        a first memory storage device configured to receive a clock signal;
        a first Registering Clock Driver (RCD) configured to receive the clock signal, and including:
            a first delay setting and a first clock delay circuit to provide a selectable first delayed clock signal based upon the first delay setting; and
            a second delay setting and a second clock delay circuit to provide a selectable second delayed clock signal based upon the second delay setting;
        a first power management integrated circuit (PMIC) including a first switching regulator, the first PMIC configured to receive the first delayed clock signal and to clock the first switching regulator based upon the first delayed clock signal; and
        a second PMIC including a second switching regulator, the second PMIC configured to receive the second delayed clock signal and to clock the second switching regulator based upon the second delayed clock signal; and
    a controller configured to set the first delay setting and the second delay setting.

2. The memory subsystem of claim 1, wherein:
    the first and second PMICs are further configured to receive a voltage input to the switching regulators; and
    the controller sets the first delay setting with a different setting than the second delay setting to minimize switching transients on the voltage input.

3. The memory subsystem of claim 1, wherein the controller is a memory controller coupled to the first RCD via a command/address bus, and the controller sets the first delay setting and the second delay setting via commands sent on the command/address bus.

4. The memory subsystem of claim 1, wherein:
    the first memory module further includes a serial presence detect (SPD) hub coupled to the RCD.

5. The memory subsystem of claim 4, wherein the controller is a baseboard management controller coupled to the SPD hub via an I2C interface, and the controller sets the first delay setting and the second delay setting via commands sent on the I2C interface.

6. The memory subsystem of claim 1, wherein:
    the first RCD further includes:
        a third delay setting and a third clock delay circuit to provide a selectable third delayed clock signal based upon the third delay setting; and
        a fourth delay setting and a fourth clock delay circuit to provide a selectable fourth delayed clock signal based upon the fourth delay setting;
    the first memory module further includes:
        a third PMIC including a third switching regulator, the third PMIC configured to receive the third delayed clock signal and to clock the third switching regulator based upon the third delayed clock signal; and
        a fourth PMIC including a fourth switching regulator, the fourth PMIC configured to receive the fourth delayed clock signal and to clock the fourth switching regulator based upon the fourth delayed clock signal; and
    the controller is further configured to set the third delay setting and the fourth delay setting.

7. The memory subsystem of claim 6, wherein the controller is configured to set the first delay setting, the second delay setting, the third delay setting, and the fourth delay setting to switch the respective first switching regulator, second switching regulator, third switching regulator, and fourth switching regulator in quadrature based upon the respective first delayed clock signal, second delayed clock signal, third delayed clock signal, and fourth delayed clock signal.

8. The memory subsystem of claim 1, wherein the first memory module is a Dual Data Rate-5 Dual In-Line Memory Module.

9. A memory module, comprising:
    a memory storage device configured to receive a clock signal;
    a Registering Clock Driver (RCD) configured to receive the clock signal, the RCD including:
        a first delay setting and a first clock delay circuit to provide a selectable first delayed clock signal based upon the first delay setting; and
        a second delay setting and a second clock delay circuit to provide a selectable second delayed clock signal based upon the second delay setting;
    a first power management integrated circuit (PMIC) including a first switching regulator, the first PMIC configured to receive the first delayed clock signal and to clock the first switching regulator based upon the first delayed clock signal; and
    a second PMIC including a second switching regulator, the second PMIC configured to receive the second delayed clock signal and to clock the second switching regulator based upon the second delayed clock signal.

10. The memory module of claim 9, wherein the RCD includes:
    a first delay setting and a first clock delay circuit, wherein the first clock delay circuit delays the first clock signal based upon the first delay setting; and
    a second delay setting and a second clock delay circuit, wherein the second clock delay circuit delays the second clock signal based upon the second delay setting.

11. The memory module of claim 10, wherein the RCD receives a first setting for the delay setting and a second setting for the second delay setting from a memory controller coupled to the RCD via a command/address bus.

12. The memory module of claim 10, further comprising:
    a serial presence detect (SPD) hub coupled to the RCD, wherein the RCD receives a first setting for the first delay setting and a second setting for the second delay setting from the SPD hub.

13. The memory module of claim 9, wherein:

the RCD further includes:
- a third delay setting and a third clock delay circuit to provide a selectable third delayed clock signal based upon the third delay setting; and
- a fourth delay setting and a fourth clock delay circuit to provide a selectable fourth delayed clock signal based upon the fourth delay setting; and the memory module further includes:
- a third PMIC including a third switching regulator, the third PMIC configured to receive the third delayed clock signal and to clock the third switching regulator based upon the third delayed clock signal; and
- a fourth PMIC including a fourth switching regulator, the fourth PMIC configured to receive the fourth delayed clock signal and to clock the fourth switching regulator based upon the fourth delayed clock signal.

14. The memory module of claim 13, wherein the PMIC is configured to set the first delay setting, the second delay setting, the third delay setting, and the fourth delay setting to switch the respective first switching regulator, second switching regulator, third switching regulator, and fourth switching regulator in quadrature based upon the respective first delayed clock signal, second delayed clock signal, third delayed clock signal, and fourth delayed clock signal.

15. The memory module of claim 9, wherein the memory module is a Dual Data Rate-5 Dual In-Line Memory Module.

16. A method, comprising:
- receiving, by a first memory storage device of a first memory module of a memory subsystem of an information handling system, a clock signal;
- receiving, by a first Registering Clock Driver (RCD) of the first memory module, the clock signal;
- delaying, by a first clock delay circuit of the first RCD, the clock signal to provide a selectable first delayed clock signal based upon a first delay setting of the first RCD;
- receiving, by a first power management integrated circuit (PMIC) of the memory module, the first delayed clock signal, wherein the first PMIC includes a first switching regulator;
- clocking, by the first PMIC, the first switching regulators based upon the first delayed clock signal; and
- delaying, by a second clock delay circuit of the first RCD, the clock signal to provide a selectable second delayed clock signal based upon a second delay setting of the first RCD;
- receiving, by a second PMIC of the memory module, the second delayed clock signal, wherein the second PMIC includes a second switching regulator;
- clocking, by the second PMIC, the second switching regulators based upon the second delayed clock signal; and
- setting, by a controller of the memory subsystem, the first delay setting and the second delay setting.

17. The method of claim 16, further comprising:
- receiving, by the first and second PMICs, a voltage input to the respective first switching regulator and second switching regulator; and
- setting, by the controller, the first delay setting with a different setting than the second delay setting to minimize switching transients on the voltage input.

18. The method of claim 16, wherein the first memory module is a Dual Data Rate-5 Dual In-Line Memory Module (DDR5 DIMM).

* * * * *